United States Patent
Tokimitsu (10) Patent No.: US 8,179,520 B2
(45) Date of Patent: May 15, 2012

(54) OPTICAL ELEMENT, PROJECTION OPTICAL SYSTEM, EXPOSURE APPARATUS, AND DEVICE FABRICATION METHOD

(75) Inventor: Takumi Tokimitsu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 521 days.

(21) Appl. No.: 12/399,587

(22) Filed: Mar. 6, 2009

(65) Prior Publication Data

US 2009/0225298 A1 Sep. 10, 2009

(30) Foreign Application Priority Data

Mar. 7, 2008 (JP) ................. 2008-058702

(51) Int. Cl.
G03B 27/72 (2006.01)
G02B 5/30 (2006.01)

(52) U.S. Cl. ......................... 355/71; 359/352
(58) Field of Classification Search ............ 355/71; 359/352

See application file for complete search history.

(56) References Cited

U.S. PATENT DOCUMENTS

2008/0297884 A1 * 12/2008 Mueller ................ 359/351

FOREIGN PATENT DOCUMENTS

JP 2004-102016 A 4/2004
JP 2004-157349 A 6/2004

* cited by examiner

Primary Examiner — Edward Glick
Assistant Examiner — Michelle Iacoletti
(74) Attorney, Agent, or Firm — Canon USA, Inc., IP Division

(57) ABSTRACT

The present invention provides an optical element which is used for light having a wavelength not more than 250 nm, and receives a light beam at a maximum incident angle not less than 55°, wherein the optical element includes an optical thin film in an effective aperture thereof, and a film thickness distribution of the optical thin film in the effective aperture includes a distribution in which a thickness of the optical thin film in an outermost periphery of the effective aperture is 1.10 times (inclusive) to 1.25 times (inclusive) a thickness of the optical thin film at a midpoint between an optical axis and the outermost periphery of the effective aperture.

12 Claims, 8 Drawing Sheets

OPTICAL ELEMENT, PROJECTION OPTICAL SYSTEM, EXPOSURE APPARATUS, AND DEVICE FABRICATION METHOD

BACKGROUND OF THE INVENTION

1. Field of the Invention

The present invention relates to an optical element, a projection optical system, an exposure apparatus, and a device fabrication method.

2. Description of the Related Art

A projection exposure apparatus has conventionally been employed to fabricate a micropatterned semiconductor device such as a semiconductor memory or logic circuit by using photolithography. The projection exposure apparatus projects and transfers a circuit pattern formed on a reticle (mask) onto a substrate such as a wafer by a projection optical system.

A minimum feature size (resolution) that the projection exposure apparatus can transfer is proportional to the wavelength of light for use in exposure (exposure light), and is inversely proportional to the numerical aperture (NA) of the projection optical system. According to this principle, the shorter the wavelength and the higher the NA, the better the resolution. To keep up with demands for advances in micropatterning of semiconductor devices, the wavelength of the exposure light has shortened, and the NA of the projection optical system has increased. In recent years, a KrF excimer laser (wavelength: about 248 nm) or an ArF excimer laser (wavelength: about 193 nm), for example, is used as the exposure light.

The projection optical system is required to minimize birefringences. The birefringences of the projection optical system are roughly classified into the glass birefringence in an optical element (transmitting element), and the phase difference between two polarization components in an optical thin film (for example, an antireflection film) formed on the surface of an optical element.

The glass birefringence as the first birefringence will be explained first. Synthetic silica and fluoride-based crystal materials are mainly used for transmitting elements of the projection optical system, which are used for light having a wavelength of 250 nm or less. The transmitting element is generally known to have an intrinsic birefringence attributed to its crystal orientation and a stress birefringence attributed to its internal stress. According to a report involved, fluorite (calcium fluoride) as one fluoride-based crystal material, for example, has an intrinsic birefringence in an amount that is non-negligible from the viewpoint of the optical performances. Amorphous materials such as synthetic silica that are widely used for light in the ultraviolet range have practically no intrinsic birefringences attributed to their crystal orientations. However, a stress birefringence thought to be attributed to a thermal stress has been experimentally observed in synthetic silica, and the influence of the amount of birefringence exerted on the optical performances of the projection optical system is not small.

The phase difference between two polarization components in an optical thin film as the second birefringence will be explained next. In general, when a light beam propagates through an antireflection film formed on the surface of a transmitting element used in the projection optical system, a difference (a phase difference between two polarization components) occurs between the transmission phases of the S- and P-polarization components of the light beam. The phase difference between two polarization components as in this case can be processed in the same way as in a birefringence generated in the transmitting element, and therefore can be regarded as a birefringence.

As the NA of the projection optical system increases, the incident angle of a light beam which enters an optical element of the projection optical system increases. Along with this trend, a projection optical system having an NA higher than 0.85 is provided with an optical element which receives, at an incident angle of 55° or more, a light beam that propagates through its outer periphery. It is very difficult to decrease the phase differences between two polarization components in an optical thin film at all incident angles on the surface of an optical element which receives a light beam at such a large incident angle. If, for example, an antireflection film is formed on the surface of synthetic silica, fluorides and oxides are known as materials (optical thin film materials) which can be used for vacuum ultraviolet light having a wavelength of 193 nm. Note that, if an antireflection film is uniformly formed on the surface of synthetic silica using these optical thin film materials, it is practically impossible to decrease the phase differences between two polarization components at all incident angles on a surface which receives a light beam at a maximum incident angle of 55° or more.

Under the circumstances, Japanese Patent Laid-Open No. 2004-157349 proposes a technique of reducing the overall birefringence of the projection optical system by canceling the glass birefringence in each optical element and the phase difference between two polarization components in an optical thin film on each surface (i.e., canceling the glass birefringence and the phase difference between two polarization components). Japanese Patent Laid-Open No. 2004-157349 discloses a method of controlling the intrinsic birefringence and stress birefringence of a crystalline glass material using the phase difference between two polarization components in an optical thin film (antireflection film) formed on the surface of an optical element. Japanese Patent Laid-Open No. 2004-102016, for example, also proposes a technique of improving the antireflection characteristic (i.e., decreasing the reflectance) of an antireflection film serving as an optical thin film, although this technique does not decrease the phase difference between two polarization components in an optical thin film.

Unfortunately, the birefringence components which can be canceled by the technique disclosed in Japanese Patent Laid-Open No. 2004-157349 are mainly limited to low-order birefringence components. This is because the configuration of an antireflection film can control low-order components of the phase difference between two polarization components, but cannot control high-order components of the phase difference between two polarization components as long as a good antireflection characteristic is maintained.

Figure 11:
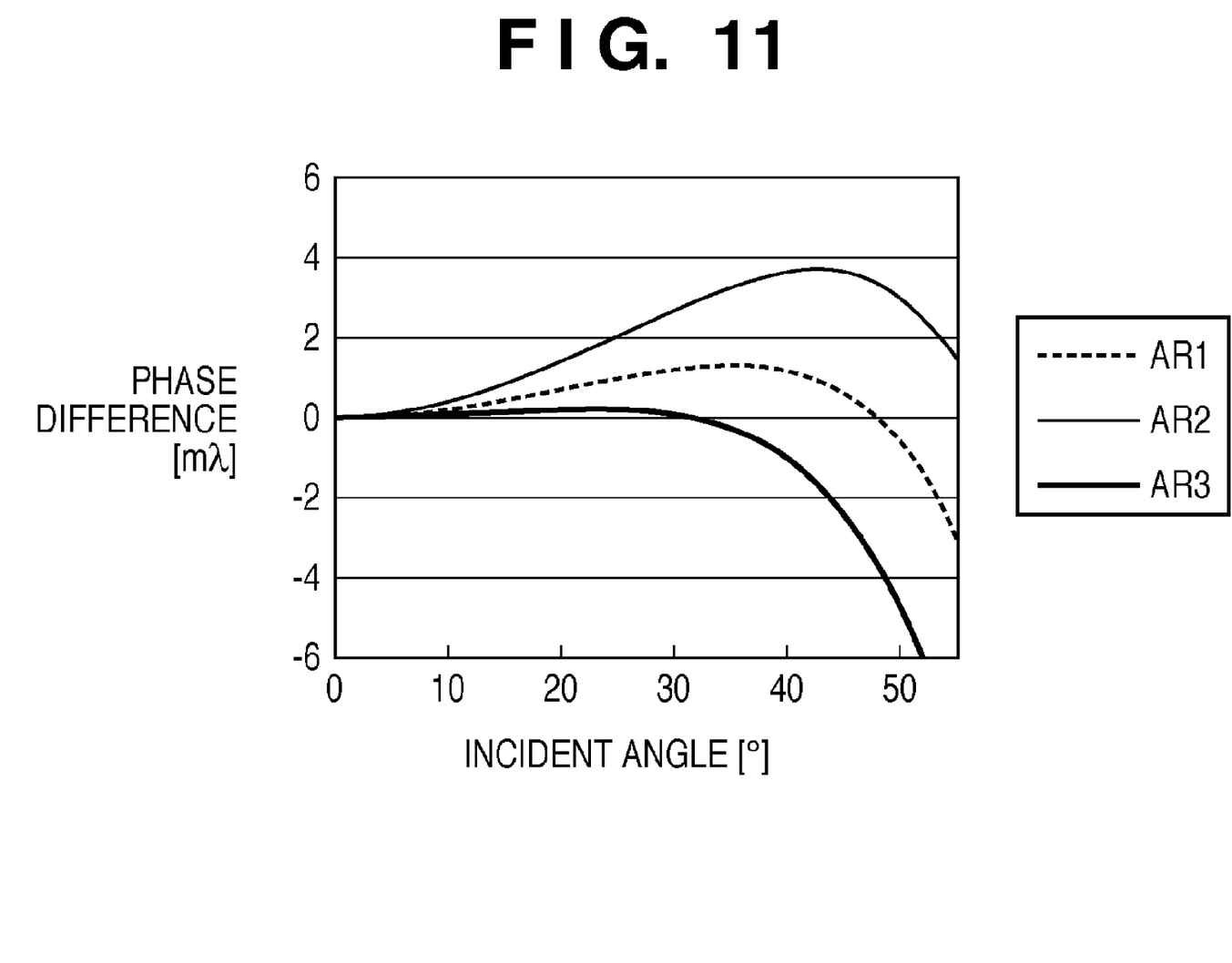
FIG. 11 is a graph showing the phase differences of three types of antireflection films for use in light having a wavelength of 193 nm as a function of the light beam incident angle.

FIG. 11 is a graph showing the phase differences of three types of antireflection films AR1, AR2, and AR3 used for light having a wavelength of 193 nm as a function of the light beam incident angle (i.e., the dependences of the phase differences on the incident angle). In FIG. 11, the ordinate indicates the phase difference [mλ] and the abscissa indicates the incident angle [°]. The antireflection films AR1, AR2, and AR3 are formed to have different phase difference characteristics while suppressing their reflectances (while maintaining their antireflection characteristics) with respect to light beams at incident angles up to 55°.

Referring to FIG. 11, obviously, the phase differences of the antireflection films AR1, AR2, and AR3 cannot practically be set to zero in the incident angle range of 0° (inclusive) to 55° (inclusive). It is possible to reduce the overall birefringence of the projection optical system by appropriately selecting the antireflection films AR1, AR2, and AR3 as antireflection films to be formed on a plurality of optical elements of the projection optical system. Note that, when the light beam incident angle exceeds 45°, the phase differences of the antireflection films AR1, AR2, and AR3 decrease as the light beam incident angle increases, as shown in FIG. 11. When the antireflection films AR1, AR2, and AR3 are appropriately selected to decrease the overall phase difference between two polarization components in the projection optical system, the phase difference components at incident angles larger than 45° remain as those hard to cancel. Such phase difference components hard to cancel appear as high-order components of the exit pupil plane distribution of the phase difference between two polarization components, and significantly degrades the optical performances of a projection optical system including an optical element which receives a light beam especially at a maximum incident angle of 55° or more.

Japanese Patent Laid-Open No. 2004-102016 also discloses a technique of decreasing the reflectance of an optical element which receives a light beam at a large incident angle in a low-NA optical system by forming, on the optical element, an antireflection film having a film thickness distribution in which the thickness increases toward the periphery of the optical element. Note that the technique disclosed in Japanese Patent Laid-Open No. 2004-102016 can decrease the reflectance of an optical element with respect to a light beam which enters it at a large incident angle, but cannot decrease the phase difference between two polarization components in an optical thin film formed on it. More specifically, Japanese Patent Laid-Open No. 2004-102016 sets the thickness of an antireflection film in the periphery of an optical element to about 1.05 times that of the antireflection film at the center of the optical element. However, such a film thickness distribution cannot sufficiently decrease the phase difference between two polarization components of a light beam at an incident angle of 55° or more. This makes it impossible to sufficiently decrease the overall phase difference between two polarization components in an optical system including an optical element which receives a light beam at an incident angle of 55° or more.

SUMMARY OF THE INVENTION

The present invention provides an optical element which can attain excellent optical characteristics by decreasing the phase difference between two polarization components even when a light beam enters the optical element at an incident angle of 55° or more.

According to one aspect of the present invention, there is provided an optical element which is used for light having a wavelength not more than 250 nm, and receives a light beam at a maximum incident angle not less than 55°, wherein the optical element comprises an optical thin film in an effective aperture thereof, and a film thickness distribution of the optical thin film in the effective aperture includes a distribution in which a thickness of the optical thin film in an outermost periphery of the effective aperture is 1.10 times (inclusive) to 1.25 times (inclusive) a thickness of the optical thin film at a midpoint between an optical axis and the outermost periphery of the effective aperture.

Further aspects and features of the present invention will become apparent from the following description of exemplary embodiments with reference to the attached drawings.

DESCRIPTION OF THE EMBODIMENTS

Preferred embodiments of the present invention will be described below with reference to the accompanying drawings. The same reference numerals denote the same members throughout the drawings, and a repetitive description thereof will not be given.

Figure 1:
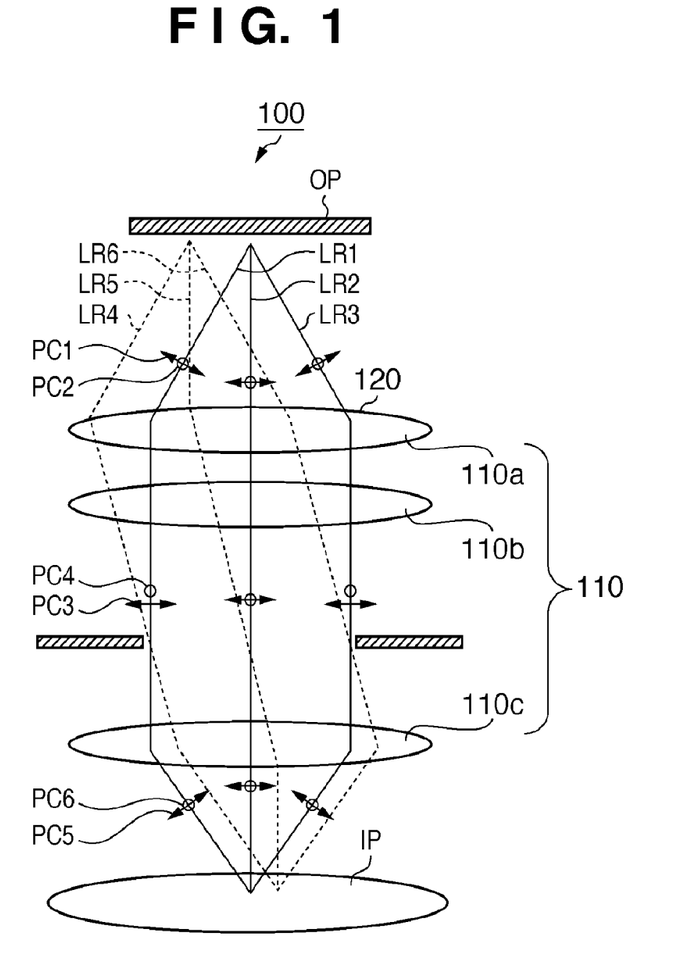
FIG. 1 is a schematic sectional view showing a projection optical system according to one aspect of the present invention.

FIG. 1 is a schematic sectional view showing a projection optical system 100 according to one aspect of the present invention. The projection optical system 100 is used for light having a wavelength of 250 nm or less, and projects the pattern in an object plane OP (for example, the pattern of a reticle inserted in the object plane OP) to an image plane IP (for example, a wafer inserted in the image plane IP). The projection optical system 100 includes a plurality of optical elements 110 which have undergone aberration correction with high accuracy and are shown as optical elements 110a, 110b, and 110c in FIG. 1 for the sake of simplicity. In FIG. 1, reference symbols $LR_1$, $LR_2$, and $LR_3$ denote light beams which pass through the optical axis, and reference symbols $LR_4$, $LR_5$, and $LR_6$ denote light beams which pass through an off-axis position. The projection optical system 100 is a telecentric optical system in this embodiment, and the light beams $LR_2$ and $LR_5$ are principal rays parallel to the optical axis.

In this embodiment, the optical element 110 is a lens (transmitting element) formed by cutting and polishing synthetic silica serving as a glass material. However, the optical element 110 is not particularly limited to a lens, and includes other optical elements such as a diffractive optical element and a reflecting element (mirror).

An optical thin film 120 is formed on the surface (more specifically, the effective light beam region) of the optical element 110. The optical thin film 120 has a function of assisting the optical action (optical characteristics) of the optical element 110, and includes, for example, an antireflection film which prevents or suppresses light reflection by the lens surface. If the optical thin film 120 is used for ultraviolet light, it is made of, for example, a low-refractive material having a refractive index of 1.4 (inclusive) to 1.6 (inclusive), and a high-refractive material having a refractive index of 1.63 (inclusive) to 1.76 (inclusive), or a high-reflective material. The low-refractive material includes, for example, magnesium fluoride ($MgF_2$). The high-refractive material includes, for example, lanthanum fluoride ($LaF_3$), neodymium fluoride ($NdF_3$), gadolinium fluoride ($GdF_3$), and samarium fluoride ($SmF_3$). The high-reflective material includes, for example, aluminum (Al) and silver (Ag).

The phase difference between two polarization components in the projection optical system 100 will be explained herein. FIG. 1 shows the polarization components of the light beams $LR_1$, $LR_2$, and $LR_3$. As for the light beam $LR_1$, polarization components before incidence on the optical element 110a are defined by $PC_1$ and $PC_2$, those after emergence from the optical element 110b are defined by $PC_3$ and $PC_4$, and those after emergence from the optical element 110c are defined by $PC_5$ and $PC_6$. Note that the polarization components $PC_1$, $PC_3$, and $PC_5$ are parallel to the paper surface, and the polarization components $PC_2$, $PC_4$, and $PC_6$ are perpendicular to the paper surface.

Referring to FIG. 1, the polarization components $PC_1$ and $PC_2$ before incidence on the optical element 110a have the same wavefront. However, after the light beam $LR_1$ propagates through the two optical elements 110a and 110b, a shift in wavefront, that is, a phase difference between two polarization components occurs between the polarization components $PC_3$ and $PC_4$. Such a phase difference between two polarization components is attributed to the birefringence in an optical element and the phase difference between two polarization components in an optical thin film formed on the surface of the optical element. When the light beam $LR_1$ reaches the image plane IP in the presence of the phase difference between two polarization components, the optical performances (for example, the imaging performance) of the projection optical system 100 degrade.

The phase difference between two polarization components in the projection optical system 100 has been corrected to a minimum, as mentioned above. However, it is difficult to correct high-order components generated as a light beam propagates through an optical element at a large incident angle.

Figure 2:
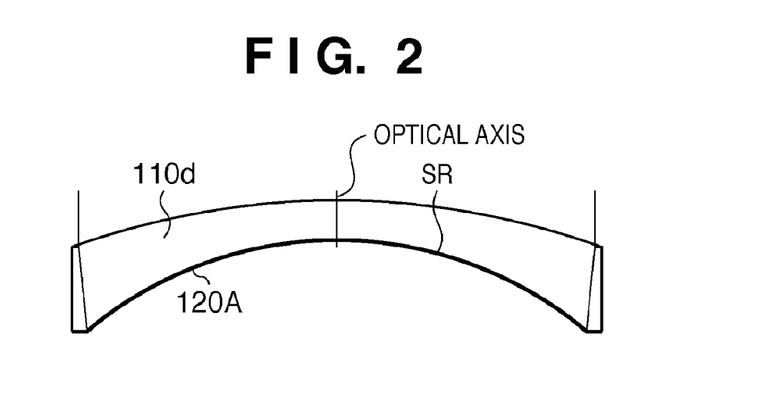
FIG. 2 is a schematic view showing an optical element used for the projection optical system shown in FIG. 1.
Figure 3:
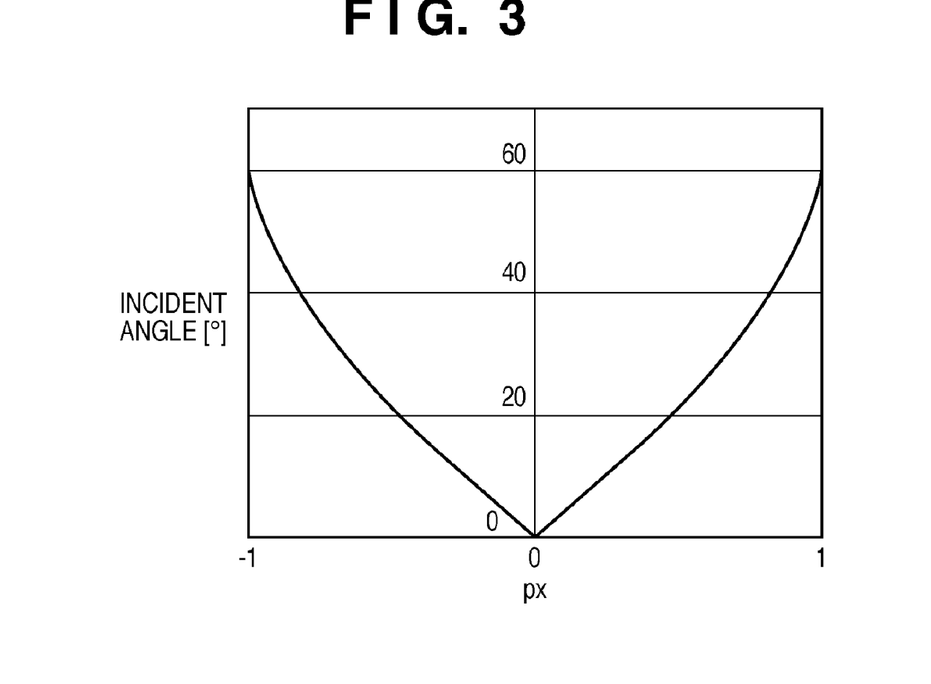
FIG. 3 is a graph showing the dependence, on the exit pupil coordinate, of the incident angle of an on-axis light beam on the surface of the optical element shown in FIG. 2.

To overcome this difficulty, an optical element 110d having, on its surface SR (effective aperture (clear aperture)), an antireflection film 120A as an example of the optical thin film 120 to solve the above-mentioned problem is used in this embodiment, as shown in FIG. 2. The optical element 110d receives a light beam at a maximum incident angle of 55° or more in the projection optical system 100. FIG. 3 shows the dependence, on the exit pupil coordinate, of the incident angle of an on-axis light beam (a light beam which passes through an object point on the optical axis) on the surface SR of the optical element 110d. In FIG. 3, the ordinate indicates the light beam incident angle [°] and the abscissa indicates the exit pupil coordinate px. Note that an optical element 110d is formed by cutting and polishing synthetic silica serving as a glass material.

The antireflection film 120A has a laminating structure in which high-refractive material layers made of high-refractive materials and low-refractive material layers made of low-refractive materials are laminated alternately. In this embodiment, the antireflection film 120A has a seven-layer structure including a first, second, third, fourth, fifth, sixth, and seventh layers in the order from the surface of the optical element 110d. The first, third, fifth, and seventh layers are low-refractive material layers made of fluorides such as magnesium fluoride. The second, fourth, and sixth layers are high-refractive material layers made of fluorides such as lanthanum fluoride.

The standard optical thicknesses of the layers of the antireflection film 120A assuming that a design wavelength $\lambda_0$ is 193 nm are as follows. The first layer has an optical thickness of $0.29\lambda_0$. The second layer has an optical thickness of $0.16\lambda_0$. The third layer has an optical thickness of $0.07\lambda_0$. The fourth layer has an optical thickness of $0.21\lambda_0$. The fifth layer has an optical thickness of $0.25\lambda_0$. The sixth layer has an optical thickness of $0.27\lambda_0$. The seventh layer has an optical thickness of $0.26\lambda_0$. Note that the optical thicknesses of the layers of the antireflection film 120A can be adjusted in the range in which the antireflection characteristic of the antireflection film 120A remains unchanged, that is, in the range of $\pm 0.05\lambda_0$ in this embodiment.

Figure 4:
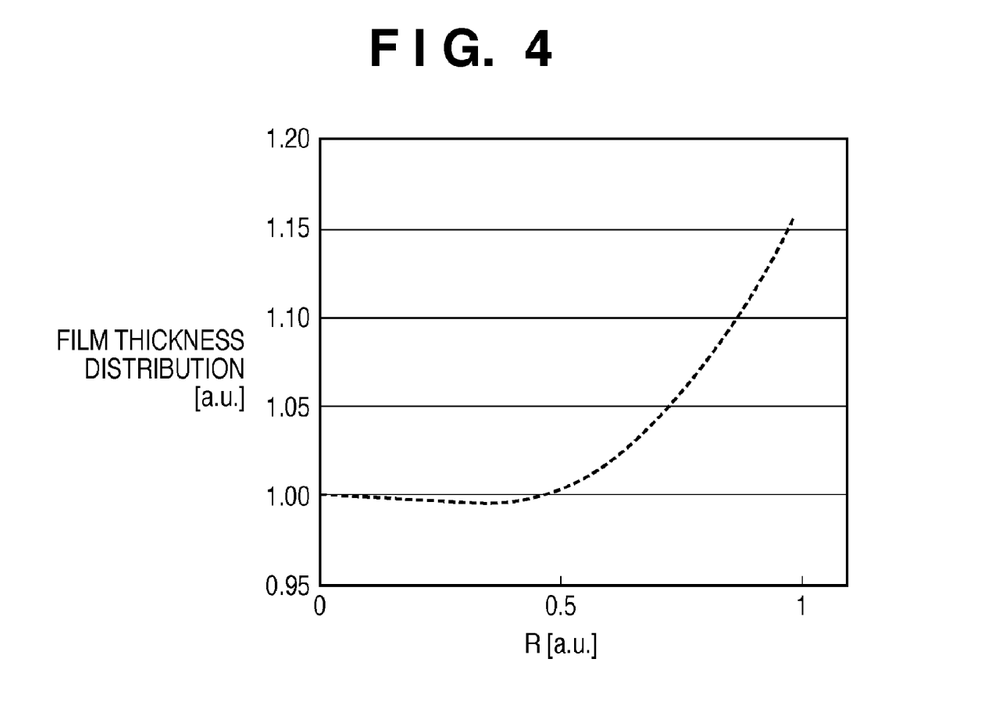
FIG. 4 is a graph showing the film thickness distribution of an antireflection film formed on the surface of the optical element shown in FIG. 2.

The antireflection film 120A has a film thickness distribution with rotation symmetry about the optical axis as the center in the effective aperture of the surface SR of the optical element 110d, as shown in FIG. 4. In FIG. 4, the ordinate indicates a film thickness distribution normalized assuming that the standard film thickness is 1, and the abscissa indicates a value R obtained by normalizing the distance from the center (optical axis) of the optical element by the radius of the effective aperture. The film thickness distribution shown in FIG. 4 is uniform throughout the layers of the antireflection film 120A, so the thickness ratios of the layers of the antireflection film 120A are equal at all positions in the effective aperture of the surface SR of the optical element lid. Referring to FIG. 4, the thickness of the antireflection film 120A is the standard thickness in the region from the center to the midpoint between the center and the outermost periphery of the effective aperture, but rapidly increases toward the outermost periphery and reaches 1.16 times the standard thickness in the outermost periphery of the effective aperture.

Figure 5:
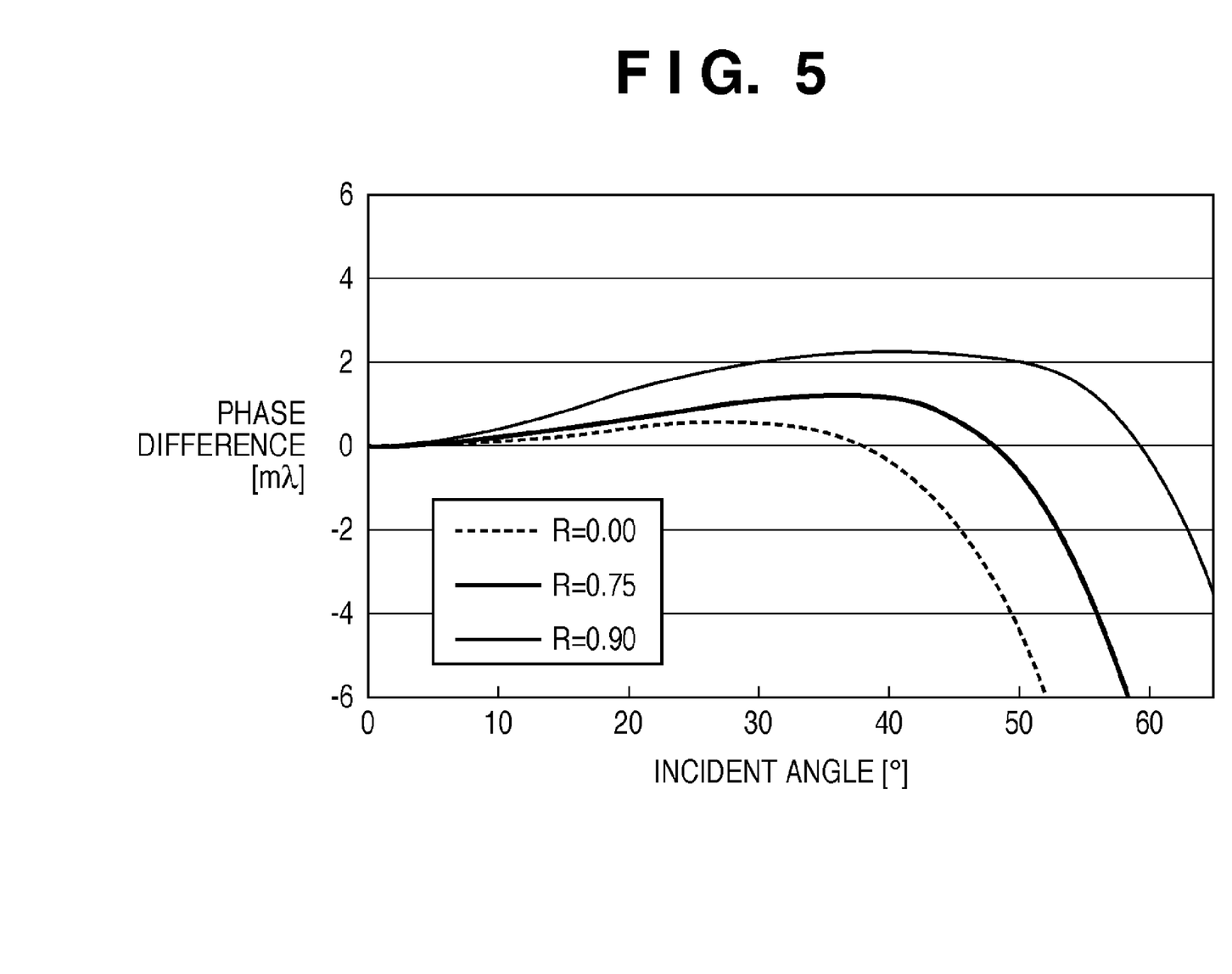
FIG. 5 is a graph showing the incident angle characteristics of the phase difference in an antireflection film having the film thickness distribution shown in FIG. 4.

When the antireflection film 120A has the film thickness distribution shown in FIG. 4, its transmission phase characteristic changes in accordance with the distance from the center of the surface SR of the optical element 110d. FIG. 5 shows the incident angle characteristics of the phase difference in the antireflection film 120A at typical positions (in this embodiment, R=0.00 (center), R=0.75, and R=0.90) on the surface SR of the optical element 110d. In FIG. 5, the ordinate indicates the phase difference [mλ] and the abscissa indicates the incident angle [°].

Referring to FIG. 5, the phase difference in the antireflection film 120A at the position R=0.00 on the surface SR of the optical element 110d falls within ±1.0 mλ in the incident angle range of 0° (inclusive) to 42° (inclusive). For this reason, the thickness of the antireflection film 120A in a region which receives a light beam at a small incident angle, that is, in the range of R=0.5 or less preferably has a constant value 1.0 time the standard thickness or its neighborhood (for example, a value 0.97 times (inclusive) to 1.03 times (inclusive) the standard thickness). The phase difference in the antireflection film 120A at the position R=0.75 on the surface SR of the optical element 110d falls within ±1.0 mλ in the incident angle range of 43° (inclusive) to 50° (inclusive).

Likewise, the phase difference in the antireflection film 120A at the position R=0.90 on the surface SR of the optical element 110d falls within ±1.0 mλ in the incident angle range of 57° (inclusive) to 61° (inclusive). In view of this, the phase difference in a region which receives a light beam at a large incident angle, that is, in a range that falls outside R=0.5 can be decreased (minimized) by rapidly changing the thickness of the antireflection film 120A in accordance with the incident position and incident angle on the surface SR of the optical element 110d. In this manner, when the antireflection film 120A has a film thickness distribution (FIG. 4) which minimizes the phase difference in accordance with the incident position and incident angle on the surface SR of the optical element 110d, it is possible to decrease the phase differences between two polarization components of all light beams which propagate through the surface SR of the optical element 110d.

The antireflection film 120A has a distinctive film thickness distribution (FIG. 4) in which the thickness rapidly increases near the outermost periphery of the optical element 110d, as mentioned above, so it is quite different from the film thickness distribution to decrease the reflectance, which is disclosed in Japanese Patent Laid-Open No. 2004-102016. When the antireflection film is imparted with a film thickness distribution by taking account of a decrease in the reflectance, there is no need to rapidly increase the thickness in the region from the center of the optical element to the outermost periphery of the optical element.

Also, an antireflection film 120A formed on the surface SR of the optical element 110d has a film thickness distribution defined by the light beam incident position and incident angle, as mentioned above. For this reason, light beams which come from on- and off-axis positions along the optical axis of the projection optical system 100 and enter the optical element 110d preferably have similar incident angle distributions, and the optical element 110d is preferably inserted at a position, which allows these light beams to enter the optical element 110d at similar incident positions, such as the vicinity of the pupil plane of the projection optical system 100.

Figure 6:
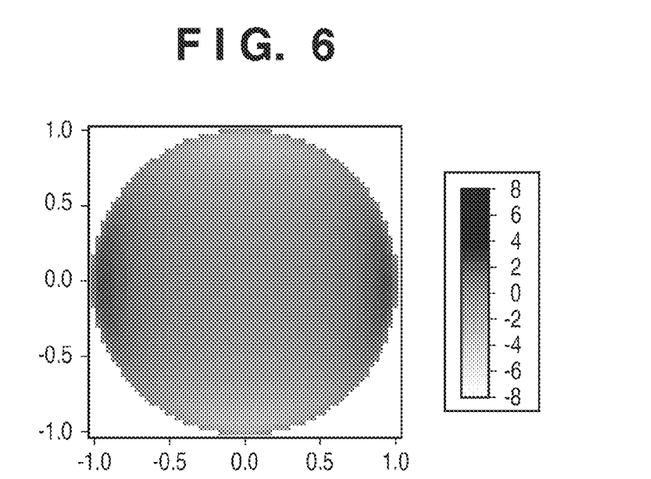
FIG. 6 is a chart showing the phase difference between two polarization components as a light beam from an object point on the optical axis has propagated through the surface of the optical element when the antireflection film has the film thickness distribution shown in FIG. 4.

The phase difference between two polarization components when the antireflection film 120A has the film thickness distribution shown in FIG. 4 will be explained next. In this embodiment, the phase difference between two polarization components is assumed to be the phase difference between the Y- and X-polarization components. FIG. 6 shows the phase difference between two polarization components as a light beam from an object point on the optical axis has propagated through the surface SR of the optical element 110d when the antireflection film 120A has the film thickness distribution shown in FIG. 4. Note that the phase difference between two polarization components shown in FIG. 6 is the distribution in an exit pupil coordinate system.

Figure 7:
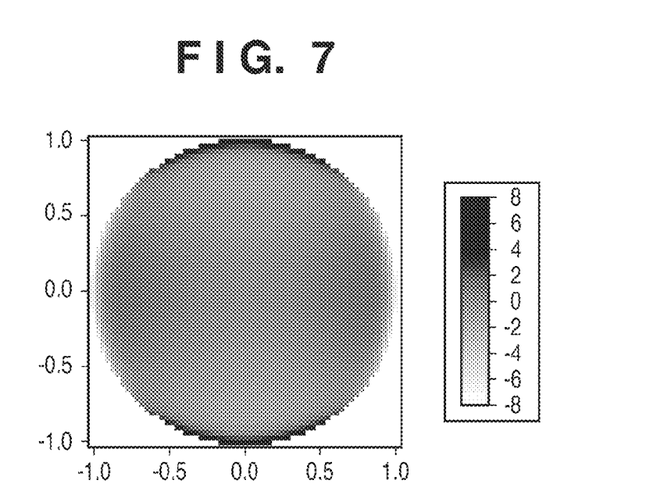
FIG. 7 is a chart showing the phase difference between two polarization components as a light beam from an object point on the optical axis has propagated through the surface of the optical element when the antireflection film does not have the film thickness distribution shown in FIG. 4.

FIG. 7 shows the phase difference between two polarization components as a light beam from an object point on the optical axis has propagated through the surface SR of the optical element 110d when the antireflection film 120A does not have the film thickness distribution shown in FIG. 4. Note that the phase difference between two polarization components shown in FIG. 7 is the distribution in an exit pupil coordinate system. That the antireflection film 120A does not have the film thickness distribution shown in FIG. 4 means that the antireflection film 120A has a uniform film thickness. The uniform film thickness is a film thickness at which the phase difference is minimum at an incident angle of 50°, that is, 1.06 times the standard thickness, which is equivalent to the thickness at the position R=0.75 on the surface SR of the optical element 110d in the film thickness distribution shown in FIG. 4.

Figure 8:
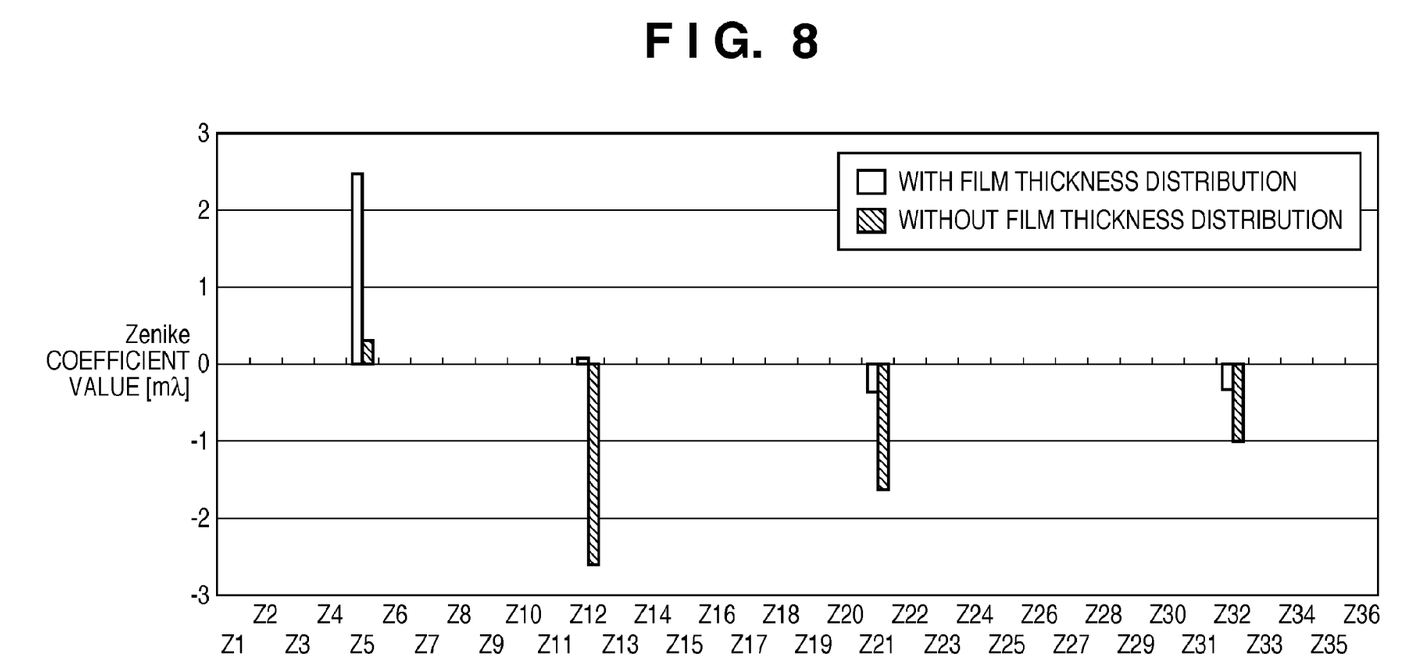
FIG. 8 is a graph showing the Zernike coefficient values when the distributions of the phase differences between two polarization components, shown in FIGS. 6 and 7, are expanded into Zernike polynomials.

FIG. 8 shows the Zernike coefficient values when the distribution of the phase difference between two polarization components shown in FIG. 6 (when the antireflection film 120A has the film thickness distribution shown in FIG. 4) and that shown in FIG. 7 (when the antireflection film 120A does not have the film thickness distribution shown in FIG. 4) are expanded into Zernike polynomials. Note that the Zernike polynomial is representation which uses polar coordinates $(R, \theta)$ as a coordinate system and uses a Zernike cylindrical function as an orthogonal function system, and is given by $$V(R, \theta) = \Sigma C_i \cdot Z_i$$

where $C_i$ is the coefficient of each term of the Zernike polynomial, and $Z_i$ is a Zernike cylindrical function given by:

$Z1: 1$ $Z2: R \cos \theta$ $Z3: R \sin \theta$ $Z4: 2R^2 - 1$ $Z5: R^2 \cos 2\theta$ $Z6: R^2 \sin 2\theta$ $Z7: (3R^3 - 2R) \cos \theta$ $Z8: (3R^3 - 2R) \sin \theta$ $Z9: (6R^4 - 6R^2 + 1)$ $Z10: R^3 \cos 3\theta$ $Z11: R^3 \sin 3\theta$ $Z12: (4R^4 - 3R^2) \cos 2\theta$ $Z13: (4R^4 - 3R^2) \sin 2\theta$ $Z14: (10R^5 - 12R^3 + 3R) \cos \theta$ $Z15: (10R^5 - 12R^3 + 3R) \sin \theta$ $Z16: (20R^6 - 30R^4 + 12R^2 - 1)$ $Z17: R^4 \cos 4\theta$ $Z18: R^4 \sin 4\theta$ $Z19: (5R^5 - 4R^3) \cos 3\theta$ $Z20: (5R^5 - 4R^3) \sin 3\theta$ $Z21: (15R^6 - 20R^4 + 6R^2) \cos 2\theta$ $Z22: (15R^6 - 20R^4 + 6R^2) \sin 2\theta$ $Z23: (35R^7 - 60R^5 + 30R^3 - 4R) \cos \theta$ $Z24: (35R^7 - 60R^5 + 30R^3 - 4R) \sin \theta$ $Z25: (70R^8 - 140R^6 + 90R^4 - 20R^2 + 1)$ $Z26: R^5 \cos 5\theta$ $Z27: R^5 \sin 5\theta$ $Z28: (6R^6 - 5R^4) \cos 4\theta$ $$Z29: (6R^6-5R^4)\sin 4\theta$$

$$Z30: (21R^7-30R^5+10R^3)\cos 3\theta$$

$$Z31: (21R^7-30R^5+10R^3)\sin 3\theta$$

$$Z32: (56R^8-105R^6+60R^4-10R^2)\cos 2\theta$$

$$Z33: (56R^8-105R^6+60R^4-10R^2)\sin 2\theta$$

$$Z34: (126R^9-280R^7+210R^5-60R^3+5R)\cos \theta$$

$$Z35: (126R^9-280R^7+210R^5-60R^3+5R)\sin \theta$$

$$Z36: (252R^{10}-630R^8+560R^6-210R^4+30R^2-1)$$

Referring to FIG. 8, the absolute value of the Zernike coefficient of the phase difference between two polarization components for Z5 when the antireflection film 120A has the film thickness distribution shown in FIG. 4 is larger than that when the antireflection film 120A does not have the film thickness distribution shown in FIG. 4. In contrast, the absolute values for high-order components of Z12, Z21, and Z32 when the antireflection film 120A has the film thickness distribution shown in FIG. 4 are much smaller than those when the antireflection film 120A does not have the film thickness distribution shown in FIG. 4. In this manner, when the antireflection film 120A has the film thickness distribution shown in FIG. 4, it is possible to satisfactorily decrease high-order components of the phase difference between two polarization components on the surface of an optical element which receives a light beam at a maximum incident angle of 55° or more.

Low-order components (for example, Z5) of the overall phase difference between two polarization components in the projection optical system 100 can be relatively easily canceled by the glass birefringence or the phase difference in an antireflection film formed on a surface which receives a light beam at a maximum incident angle as small as, for example, 50° or less (preferably, 45° or less). On the other hand, high-order components (for example, Z12, Z21, and Z32) of the overall phase difference between two polarization components in the projection optical system 100 are very hard to cancel by the glass birefringence or the phase difference in the antireflection film. However, the generation of high-order components of the phase difference between two polarization components can be prevented using an optical element 110d, on which an antireflection film 120A having the film thickness distribution shown in FIG. 4 is formed, as an optical element which receives a light beam at a maximum incident angle of 55° or more. Hence, it is possible to satisfactorily decrease the overall phase difference between two polarization components in the projection optical system 100. In other words, it is possible to decrease the Zernike coefficient values of the overall phase difference between two polarization components in the projection optical system 100 over low-order and high-order components.

Figure 9:
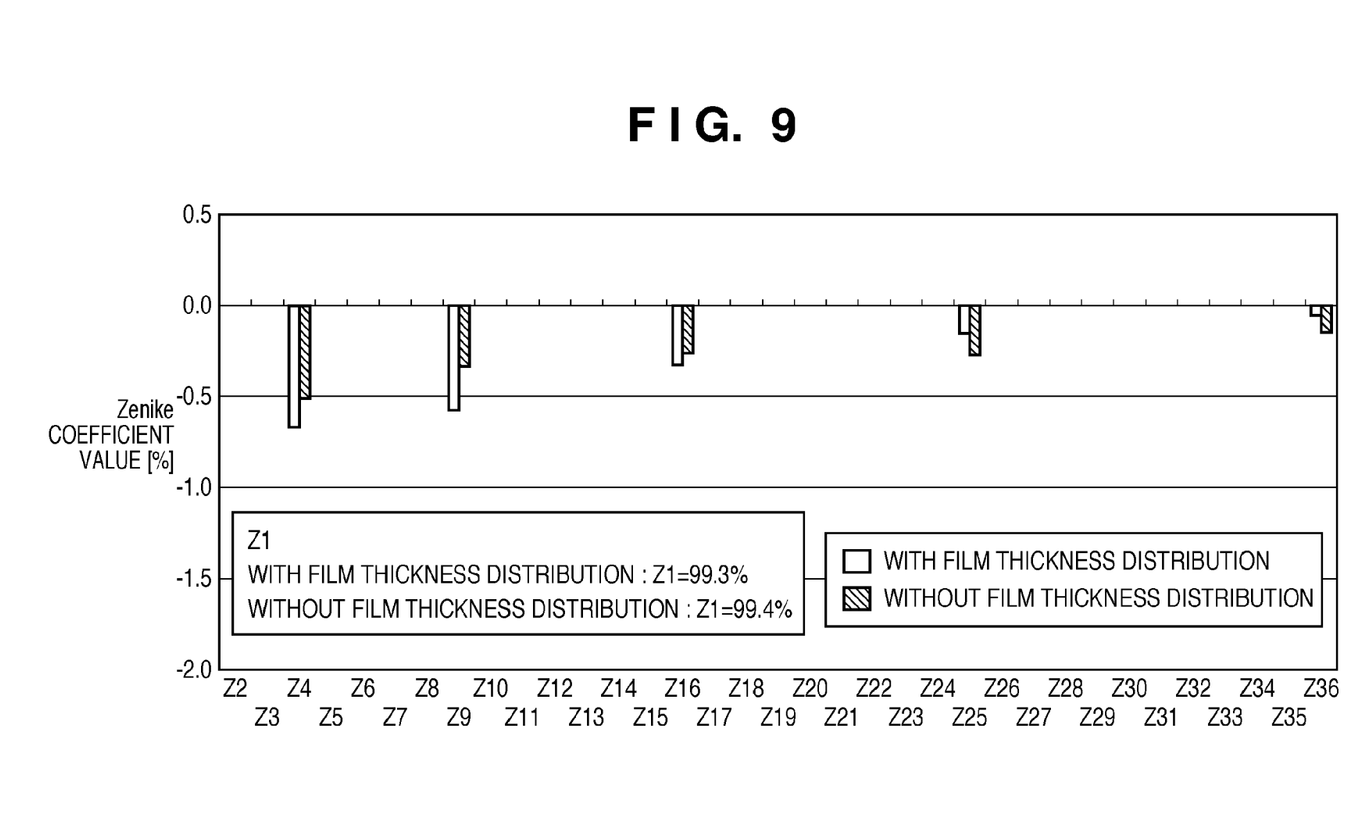
FIG. 9 is a graph showing the Zernike coefficient values when the exit pupil coordinate distributions of the transmittances with respect to randomly polarized light when the antireflection film has the film thickness distribution shown in FIG. 4 and when it does not have the film thickness distribution shown in FIG. 4 are expanded into Zernike polynomials.

The transmittance of an optical element 110d on which an antireflection film 120A having the film thickness distribution shown in FIG. 4 is formed will be explained next. FIG. 9 shows the Zernike coefficient values when the exit pupil coordinate distributions of the transmittances with respect to randomly polarized light when the antireflection film 120A has the film thickness distribution shown in FIG. 4 and when it does not have the film thickness distribution shown in FIG. 4 are expanded into Zernike polynomials.

Referring to FIG. 9, there is no significant difference between the transmittances with respect to randomly polarized light when the antireflection film 120A has the film thickness distribution shown in FIG. 4 and when it does not have the film thickness distribution shown in FIG. 4. Hence, the transmittance practically does not decrease even upon imparting the film thickness distribution shown in FIG. 4 to the antireflection film 120A in order to decrease high-order components of the phase difference between two polarization components.

Also referring to FIG. 9, both the transmittances with respect to randomly polarized light when the antireflection film 120A has the film thickness distribution shown in FIG. 4 and when it does not have the film thickness distribution shown in FIG. 4 are high. However, it is impossible to obtain a significant effect even when the reflectance is decreased to further increase the transmittance using the technique disclosed in Japanese Patent Laid-Open No. 2004-102016. This is because importance is attached to selection of the basic configuration (e.g., an optical thin film material) of an antireflection film in order to improve its antireflection characteristic when the light beam incident angle on it is very large (55° or more).

Although the thickness of the antireflection film 120A at the position R=1 on the surface SR of the optical element 110d is 1.16 times the standard thickness in this embodiment, the present invention is not particularly limited to this. The thickness of the antireflection film 120A at the position R=1 on the surface SR of the optical element 110d has a preferable value which changes in the range of 1.10 times (inclusive) to 1.25 times (inclusive) the standard thickness, depending on the maximum incident angle and incident angle distribution of a light beam which enters the optical element of the projection optical system 100, and the optical path of an off-axis light beam. Note that, when the thickness of the antireflection film 120A at the position R=1 on the surface SR of the optical element 110d is smaller than 1.10 times the standard thickness, it is impossible to satisfactorily obtain an effect of decreasing high-order components of the phase difference. Note also that, when the thickness of the antireflection film 120A at the position R=1 on the surface SR of the optical element 110d is larger than 1.25 times the standard thickness, it is impossible to obtain a satisfactory antireflection characteristic, resulting in a decrease in the transmittance and deterioration in the exit pupil plane distribution of the transmittance.

In this manner, an optical element 110d having a surface SR on which an antireflection film 120A having the film thickness distribution shown in FIG. 4 is formed can decrease high-order components of the phase difference between two polarization components without decreasing the transmittance even when a light beam enters the optical element 110d at an incident angle of 55° or more. In other words, an optical element 110d having a surface SR on which an antireflection film 120A having the film thickness distribution shown in FIG. 4 is formed can attain excellent optical characteristics by decreasing the phase difference between two polarization components.

Figure 10:
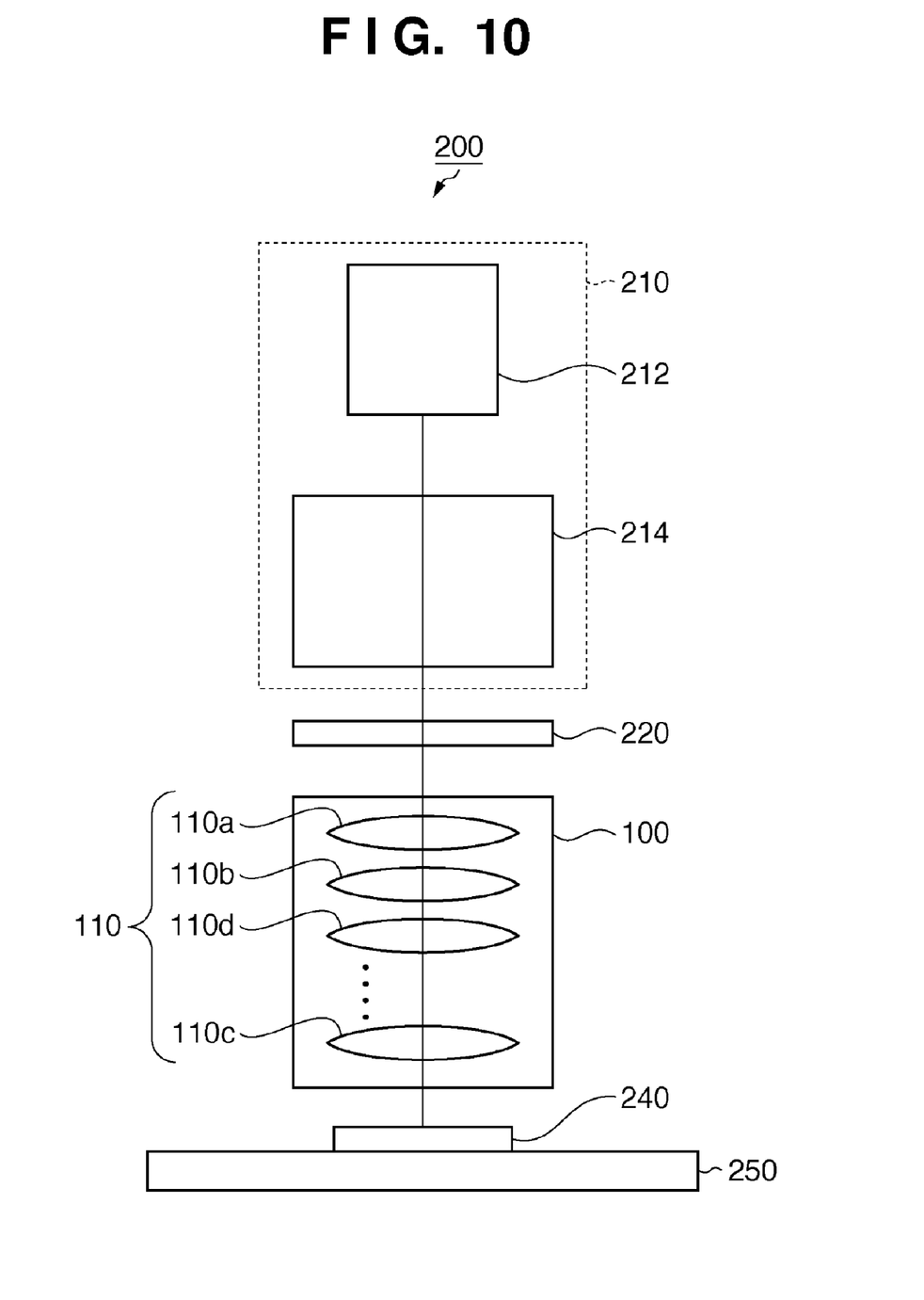
FIG. 10 is a schematic view showing an exposure apparatus according to one aspect of the present invention.

An exposure apparatus 200 to which the projection optical system 100 is applied will be explained below with reference to FIG. 10. FIG. 10 is a schematic view showing the exposure apparatus 200 according to one aspect of the present invention.

The exposure apparatus 200 is a projection exposure apparatus which transfers the pattern of a reticle 220 onto a wafer 240 by exposure using the step & scan scheme. However, the exposure apparatus 200 can adopt the step & repeat scheme or another exposure scheme.

The exposure apparatus 200 includes an illumination apparatus 210, a reticle stage (not shown) which supports the reticle 220, the projection optical system 100, and a wafer stage 250 which supports the wafer 240, as shown in FIG. 10.

The illumination apparatus 210 illuminates the reticle 220 on which a circuit pattern to be transferred is formed, and includes a light source 212 and illumination optical system 214.

The light source 212 is, for example, an excimer laser such as an ArF excimer laser having a wavelength of about 193 nm or a KrF excimer laser having a wavelength of about 248 nm. However, the light source 212 is not particularly limited to an excimer laser, and may be an $F_2$ laser having a wavelength of about 157 nm or a mercury lamp having a narrow wavelength range.

The illumination optical system 214 illuminates the reticle 220 with light from the light source 212, and includes, for example, a lens, mirror, optical integrator, and stop.

The reticle 220 has a circuit pattern and is supported and driven by the reticle stage (not shown). Diffracted light generated by the reticle 220 is projected onto the wafer 240 via the projection optical system 100. Since the exposure apparatus 200 is of the step & scan scheme, it transfers the pattern of the reticle 220 onto the wafer 240 by scanning them.

The projection optical system 100 projects the pattern of the reticle 220 onto the wafer 240. The projection optical system 100 includes a plurality of optical elements 110 including an optical element 110d having a surface SR on which an antireflection film 120A having the film thickness distribution shown in FIG. 4 is formed near the pupil plane, as mentioned above.

The wafer 240 is a substrate onto which the pattern of the reticle 220 is projected (transferred), and is supported and driven by the wafer stage 250. However, a glass plate or another substrate can be used in place of the wafer 240.

The wafer stage 250 supports and drives the wafer 240. The wafer stage 250 can take any form known to those skilled in the art, and a description of its detailed structure and operation will not be given herein.

In exposure, light emitted by the light source 212 illuminates the reticle 220 by the illumination optical system 214. The light which bears the information of the pattern of the reticle 220 forms an image on the wafer 240 by the projection optical system 100. The projection optical system 100 used in the exposure apparatus 200 can attain excellent optical characteristics by decreasing the phase difference between two polarization components, as mentioned above. Hence, the exposure apparatus 200 can provide high-quality devices (e.g., a semiconductor integrated circuit device and a liquid crystal display device) with a high throughput and a good economical efficiency. The devices are fabricated by a step of exposing a substrate (e.g., a wafer or a glass plate) coated with a photoresist (photosensitive agent) using the exposure apparatus 200, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-058702, filed on Mar. 7, 2008, which is hereby incorporated by reference herein in its entirety.

What is claimed is:

1. An optical element which is used for light having a wavelength not more than 250 nm, and receives a light beam at a maximum incident angle not less than 55°, wherein the optical element comprises an optical thin film in an effective aperture thereof, and a film thickness distribution of the optical thin film in the effective aperture includes a distribution in which a thickness of the optical thin in a region from an optical axis to a midpoint between the optical axis and an outermost periphery of the effective aperture is in a neighborhood of a thickness of the optical thin film on the optical axis, and a distribution in which a thickness of the optical thin film in the outermost periphery of the effective aperture is 1.10 times (inclusive) to 1.25 times (inclusive) a thickness of the optical thin film at the midpoint between the optical axis and the outermost periphery of the effective aperture.

2. The element according to claim 1, wherein the film thickness distribution includes a distribution in which a change ratio of the thickness of the optical thin film from the optical axis to the midpoint between the optical axis and the outermost periphery of the effective aperture is smaller than a change ratio of the thickness of the optical thin film from the midpoint between the optical axis and the outermost periphery of the effective aperture to the outermost periphery of the effective aperture.

3. The element according to claim 1, wherein
the optical thin film has a laminating structure in which high-refractive material layers and low-refractive material layers are laminated alternately, and
thickness ratios of the layers of the laminating structure are equal at all positions in the effective aperture.

4. The element according to claim 3, wherein the laminating structure includes a seven-layer structure.

5. The element according to claim 1, wherein
the optical element essentially consists of synthetic silica,
the optical thin film includes a first layer formed from a low-refractive material layer, a second layer formed from a high-refractive material layer, a third layer formed from a low-refractive material layer, a fourth layer formed from a high-refractive material layer, a fifth layer formed from a low-refractive material layer, a sixth layer formed from a high-refractive material layer, and a seventh layer formed from a low-refractive material layer in an order from a surface of the optical element, and
letting $\lambda_0$ be the wavelength of the light,
the first layer has an optical thickness of $(0.29\pm0.05)\lambda_0$,
the second layer has an optical thickness of $(0.16\pm0.05)\lambda_0$,
the third layer has an optical thickness of $(0.07\pm0.05)\lambda_0$,
the fourth layer has an optical thickness of $(0.21\pm0.05)\lambda_0$,
the fifth layer has an optical thickness of $(0.25\pm0.05)\lambda_0$,
the sixth layer has an optical thickness of $(0.27\pm0.05)\lambda_0$, and
the seventh layer has an optical thickness of $(0.26\pm0.05)\lambda_0$.

6. A projection optical system used for light having a wavelength not more than 250 nm, the system comprising:
an optical element which includes an optical thin film in an effective aperture thereof, and is configured to receive a light beam at a maximum incident angle not less than 55°,
wherein a film thickness distribution of the optical thin film in the effective aperture includes a distribution in which a thickness of the optical thin film in a region from an optical axis to a midpoint between the optical axis and an outermost periphery of the effective aperture is in a neighborhood of a thickness of the optical thin film on the optical axis, and a distribution in which a thickness of the optical thin film in the outermost periphery of the effective aperture is 1.10 times (inclusive) to 1.25 times (inclusive) a thickness of the optical thin film at the midpoint between the optical axis and the outermost periphery of the effective aperture.

7. The system according to claim 6, wherein the optical element is set near a pupil plane of the projection optical system.

8. An exposure apparatus projecting a pattern of a reticle onto a substrate via a projection optical system defined in claim 6, thereby exposing the substrate.

9. An exposure apparatus comprising:
an illumination optical system configured to illuminate a reticle with light from a light source; and
a projection optical system configured to project a pattern of the reticle onto a substrate,
wherein the projection optical system is used for light having a wavelength not more than 250 nm, and includes an optical element configured to receive a light beam at a maximum incident angle not less than 55°,
wherein the optical element includes an optical thin film in an effective aperture thereof, and
a film thickness distribution of the optical thin film in the effective aperture includes a distribution in which a thickness of the optical thin film in a region from an optical axis to a midpoint between the optical axis and an outermost periphery of the effective aperture is in a neighborhood of a thickness of the optical thin film on the optical axis, and a distribution in which a thickness of the optical thin film in the outermost periphery of the effective aperture is 1.10 times (inclusive) to 1.25 times (inclusive) a thickness of the optical thin film at the midpoint between an optical axis and the outermost periphery of the effective aperture.

10. A device fabrication method comprising steps of:
exposing a substrate using an exposure apparatus; and performing a development process for the substrate exposed,
wherein the exposure apparatus includes:
an illumination optical system configured to illuminate a reticle with light from a light source; and
a projection optical system configured to project a pattern of the reticle onto the substrate,
wherein the projection optical system is used for light having a wavelength not more than 250 nm, and includes an optical element configured to receive a light beam at a maximum incident angle not less than 55°,
wherein the optical element includes an optical thin film in an effective aperture thereof, and
a film thickness distribution of the optical thin film in the effective aperture includes a distribution in which a thickness of the optical thin film in a region from an optical axis to a midpoint between the optical axis and an outermost periphery of the effective aperture is in a neighborhood of a thickness of the optical thin film on the optical axis, and a distribution in which a thickness of the optical thin film in the outermost periphery of the effective aperture is 1.10 times (inclusive) to 1.25 times (inclusive) a thickness of the optical thin film at the midpoint between the optical axis and the outermost periphery of the effective aperture.

11. The element according to claim 1, wherein the optical thin film includes a region in which a thickness of the optical thin film decreases toward the outermost periphery of the effective aperture from the optical axis, in the region from the optical axis to the midpoint between the optical axis and the outermost periphery of the effective aperture.

12. The element according to claim 1, wherein the optical thin film includes a region in which a thickness of the optical thin film is smaller than the thickness of the optical thin film on the optical axis, in the region from the optical axis to the midpoint between the optical axis and the outermost periphery of the effective aperture.

* * * * *